US007423456B2

(12) United States Patent
Gomm et al.

(10) Patent No.: US 7,423,456 B2
(45) Date of Patent: Sep. 9, 2008

(54) FAST RESPONSE TIME, LOW POWER PHASE DETECTOR CIRCUITS, DEVICES AND SYSTEMS INCORPORATING THE SAME, AND ASSOCIATED METHODS

(75) Inventors: Tyler Gomm, Boise, ID (US); Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/607,614

(22) Filed: Dec. 1, 2006

(65) Prior Publication Data

US 2008/0130396 A1 Jun. 5, 2008

(51) Int. Cl.
*G01R 25/00* (2006.01)
(52) U.S. Cl. .................... 327/12; 327/3; 327/7
(58) Field of Classification Search .......... 327/2, 327/3, 12, 17, 147, 149, 156, 158, 162, 163
See application file for complete search history.

(56) References Cited

U.S. PATENT DOCUMENTS

| | | | |
|---|---|---|---|
| 3,693,099 A | 9/1972 | Oberst | 327/7 |
| 4,009,448 A | 2/1977 | Hopwood et al. | 331/4 |
| 4,190,807 A | 2/1980 | Weber | 331/1 A |
| 4,313,089 A | 1/1982 | Predina | 328/155 |
| 4,419,760 A | 12/1983 | Bjornholt | 375/120 |
| 4,459,560 A | 7/1984 | Kurihara | 331/2 |
| 4,470,018 A | 9/1984 | Steinlin | 328/133 |
| 4,523,157 A | 6/1985 | Sato | 331/4 |
| 4,565,976 A | 1/1986 | Campbell | 331/57 |
| 4,599,570 A | 7/1986 | Cloke | 328/155 |
| 4,612,515 A | 9/1986 | Ohkawa et al. | 331/1 A |
| 4,642,562 A | 2/1987 | Collins et al. | 324/83 D |
| 4,691,175 A | 9/1987 | Ecklund | 331/1 A |
| 4,750,193 A | 6/1988 | Bailey | 375/81 |
| 4,752,748 A | 6/1988 | Grzeszykowski | 331/1 A |
| 4,814,726 A | 3/1989 | Byrd et al. | 331/1 A |
| 4,862,106 A | 8/1989 | Toda et al. | 331/2 |
| 4,987,387 A | 1/1991 | Kennedy et al. | 331/1 A |
| 5,034,748 A | 7/1991 | Goedeke et al. | 342/99 |
| 5,057,793 A | 10/1991 | Cowley et al. | 331/1 A |
| 5,239,561 A | 8/1993 | Wong et al. | 375/81 |
| 5,329,559 A | 7/1994 | Wong et al. | 375/119 |
| 5,400,034 A | 3/1995 | Smith | 342/103 |
| 5,477,177 A | 12/1995 | Wong et al. | 327/156 |
| 5,594,361 A | 1/1997 | Campbell | 326/24 |
| 5,602,884 A | 2/1997 | Wieczorkiewicz et al. | 375/376 |
| 5,646,968 A | 7/1997 | Kovacs et al. | 375/375 |
| 5,815,016 A * | 9/1998 | Erickson | 327/158 |
| 5,953,284 A | 9/1999 | Baker et al. | 365/233 |
| 5,977,801 A | 11/1999 | Boerstler | 327/7 |
| 6,040,742 A | 3/2000 | Bailey et al. | 331/2 |

(Continued)

*Primary Examiner*—N. Drew Richards
*Assistant Examiner*—Hai L. Nguyen
(74) *Attorney, Agent, or Firm*—Dorsey & Whitney LLP

(57) ABSTRACT

A circuit for quickly accomplishing highly accurate phase detection using low power is described. The circuit includes a phase decision circuit that receives two clock signals and detects the phase relationship between the two signals by determining which signal was received first. In response, the phase decision circuit generates respective logic signals to reflect the phase relationship determination. The circuit also includes a latch circuit that receives the logic signals from the phase decision circuit and holds the phase relationship determination of the circuit a predetermined time after a predetermined transition of both clock signals have occurred. Methods and systems are also disclosed.

33 Claims, 7 Drawing Sheets

U.S. PATENT DOCUMENTS

| | | | |
|---|---|---|---|
| 6,094,078 A | 7/2000 | Suzuki | 327/156 |
| 6,101,197 A | 8/2000 | Keeth et al. | 370/517 |
| 6,154,096 A | 11/2000 | Chien | 331/17 |
| 6,173,432 B1 | 1/2001 | Harrison | 716/1 |
| 6,259,755 B1 | 7/2001 | O'Sullivan et al. | 375/376 |
| 6,275,072 B1 | 8/2001 | Dally et al. | 327/7 |
| 6,320,436 B1 | 11/2001 | Fawcett et al. | 327/158 |
| 6,323,692 B1 | 11/2001 | Tsinker | 327/12 |
| 6,356,129 B1 | 3/2002 | O'Brien et al. | 327/175 |
| 6,392,495 B1 | 5/2002 | Larsson | 331/11 |
| 6,480,047 B2 | 11/2002 | Abdel-Maguid et al. | 327/161 |
| 6,496,554 B1 | 12/2002 | Ahn | 375/376 |
| 6,512,711 B1 | 1/2003 | Wright et al. | 365/203 |
| 6,531,926 B1 | 3/2003 | Pate et al. | 331/17 |
| 6,538,517 B2 | 3/2003 | Lu | 331/17 |
| 6,545,507 B1 | 4/2003 | Goller | 326/93 |
| 6,586,979 B2 * | 7/2003 | Gomm et al. | 327/161 |
| 6,590,427 B2 * | 7/2003 | Murphy et al. | 327/12 |
| 6,636,090 B2 | 10/2003 | Ito | 327/157 |
| 6,640,194 B2 | 10/2003 | Little et al. | 702/74 |
| 6,646,478 B2 | 11/2003 | Lamb | 327/12 |
| 6,704,382 B1 | 3/2004 | Metzler et al. | 375/376 |
| 6,744,293 B1 | 6/2004 | Fu et al. | 327/158 |
| 6,762,626 B1 | 7/2004 | Dreps et al. | 327/2 |
| 6,774,687 B2 | 8/2004 | Gomm et al. | 327/158 |
| 6,779,126 B1 * | 8/2004 | Lin et al. | 713/500 |
| 6,801,094 B2 * | 10/2004 | Aoki et al. | 331/25 |
| 6,839,394 B1 | 1/2005 | Duffy | 375/376 |
| 6,873,669 B2 | 3/2005 | Nakamura | 375/375 |
| 7,119,583 B2 * | 10/2006 | Johnson et al. | 327/12 |
| 7,123,069 B2 * | 10/2006 | Minzoni | 327/216 |
| 2006/0273828 A1 | 12/2006 | Johnson et al. | 327/12 |

\* cited by examiner

FAST RESPONSE TIME, LOW POWER PHASE DETECTOR CIRCUITS, DEVICES AND SYSTEMS INCORPORATING THE SAME, AND ASSOCIATED METHODS

TECHNICAL FIELD

Embodiments of the invention relate to integrated circuits, and more specifically to an apparatus and method for providing highly accurate phase detection to generate a control signal based on the phase relationship between two input clock signals.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors. The timing of signals external to a synchronous memory device is determined by the external clock signal, and operations within the memory device are typically synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to clock the commands into the latches. The internal clock signal and external clock must be synchronized to ensure the internal clock signal clocks the latches at the proper times to successfully capture the commands. In the present description, "external" refers to signals and operations outside of the memory device, and "internal" refers to signals and operations within the memory device. Moreover, although the present description is directed to synchronous memory devices, the principles described herein are equally applicable to other types of synchronous integrated circuits.

Phase detectors are used in synchronous circuits such as phase-locked loops (PLLs) and delay-locked loops (DLLs) to provide control signals for adjusting a variable delay value to establish a predetermined phase relationship between the internal and external clock signals. For example, where the desired phase relationship between the two clock signals is zero degrees, the phase detector will detect any phase difference between the two clock signals and generate a control signal that is received by a shift register to advance or delay a local signal. Some phase detectors for DLL circuits utilize an arbiter-based detection, where an arbiter circuit receives the two clock signals and makes a decision to add a delay or remove a delay depending on which signal was received first. FIG. 1 shows a block diagram of a conventional phase detector 100 that includes arbiters 115, 117, 119. The phase detector 100 receives two clock signals DLLREF and DLLFB, and a phase detector enable signal ENPD. The DLLREF signal is typically a reference or external clock signal, and the DLLFB signal is an internal clock signal, such as from the feedback loop of a DLL. The phase detector 100 includes two arbiters 115, 117 for comparing the received DLLREF and DLLFB signals.

While a single arbiter, such as the upper arbiter 115 can be used to determine the phase difference of the two received signals, the second arbiter 117 is included in the design to create a two-arbiter scheme that is used to add some hysteresis to the phase detector 100. Some DLL designs use two-arbiter phase detector designs to provide a certain amount of hysteresis to eliminate undesired DLL loop oscillation. The DLLREF and DLLFB clock signals are received by a respective NAND gate 110a-d, along with the ENPD signal. When the NAND gates 110a-d are enabled by a high ENPD signal, each of the NAND gates 110a-d couple either the DLLREF clock signal or the DLLFB clock signal to the input of a respective fine delay line 112a-e that adds a delay to the DLLREF clock signal or the DLLFB clock signal to generate respective CLKREF1 or CLKFB1 clock signals. In the example shown in FIG. 1, the delay $DL_1$ of fine delays 112a, 112d are greater than the delay $DL_2$ of the fine delays 112b, 112c. As explained below, the differences in these delay $DL_1$, $DL_2$ establish a hysteresis for the phase detector 100. Assume initially that the DLLREF clock signal leads the DLLFB signal. The delays $DL_1$ and $DL_2$ are set so that the CLKFB1 signal will lead the CLKREF1 signal if the DLLREF clock signal leads the DLLFB signal by a relatively small amount that is within a hysteresis window. In other words, CLKREF1 delayed by $DL_1$ will lag CLKFB1 delayed by the delay $DL_2$. In such case, the upper arbiter 115 will output a high FBFIRST signal and a low REFFIRST signal. However, if the DLLREF clock signal leads the DLLFB signal by amount that is larger than the hysteresis window, the CLKREF1 clock signal will lead the CLKFB1 clock signal despite the greater delay $DL_1$ applied on the DLLREF clock signal relative to the delay $DL_2$ applied on the DLLFB clock signal. In such case, the upper arbiter 115 will output a high REFFIRST signal and a low FBFIRST signal. In summary, the upper arbiter 115 will output a high REFFIRST signal and a low FBFIRST signal only if the DLLREF signal leads the DLLFB signal by an amount that is greater than the hysteresis window. In all other cases, the upper arbiter 115 will output a low REFFIRST signal and a high FBFIRST signal. Therefore, a NAND gate 120a will receive a logic "1" signal from the upper arbiter 115 only if the CLKREF1 signal leads the CLKFB1 signal by an amount that is greater than the hysteresis window.

The lower arbiter 117 operates in a similar manner except that the DLLFB clock signal is delayed by the fine delay 112d to a greater extent than the DLLREF clock signal is delayed by the fine delay line 112c. Therefore, if the DLLREF clock signal leads the DLLFB clock signal the CLKREF2 signal will always lead the CLKFB2 clock signal regardless of how much the DLLREF clock signal leads the DLLFB clock signal. Therefore, if the DLLREF clock signal leads the DLLFB clock signal, the lower arbiter 117 will always output a high REFFIRST and a low FBFIRST signal. In such case, a NAND gate 120b will receive a logic "0" from the lower arbiter 117.

The lower arbiter 117 functions in response to the DLLFB clock signal leading the DLLREF clock signal in the same manner as the upper arbiter 115 functions in response to the DLLREF clock signal leading the DLLFB clock signal. Therefore, the lower arbiter 117 will output a high FBFIRST signal only if the DLLREF clock signal lags the DLLFB clock signal by more than the hysteresis window, and the upper arbiter will output a high FBFIRST signal as long as the DLLREF clock signal lags the DLLREF signal regardless of the amount the DLLREF clock signal lags the DLLFB signal. Therefore, the NAND gate 120b will receive a logic "1" signal from the lower arbiter 117 only if the CLKREF2 signal lags the CLKFB2 signal by an amount that is greater than the hysteresis window. Insofar as the upper arbiter 115 always outputs a high FBFIRST signal if the DLLREF clock signal lags the DLLFB clock signal, the NAND gate 120b outputs low if the CLKREF2 signal lags the CLKFB2 signal by an amount that is greater than the hysteresis window.

In summary, the NAND gate 120a outputs a low if the DLLREF clock signal leads the DLLFB clock signal by an amount that is greater than the hysteresis window, and the NAND gate 120b outputs a low if the DLLREF clock signal lags the DLLFB signal by an amount that is greater than the hysteresis window. The NAND gates 120a,b will each output a logic "1" if the difference in phase between the DLLREF and DLLFB signals is less than the hysteresis window.

The outputs of the NAND gates 120a,b are applied to a latch 125, which samples the outputs after each phase comparison has been made. Since the decision of the arbiters 115, 117 lasts only as long as the narrowest pulse width of the input clock signals, the decision must be strobed with a matched clock. To perform this function, one of the input clock signals, the DLLREF clock signal, is applied to a model arbiter 119 through a matched fine delay 112e which has a delay $DL_1$ that is the same delay as the delay provided by the fine delay 112a. As a result, a transition of a CLKREF3 clock signal occurs at the time a transition of the CLKREF1 clock signal occurs. The other input clock signal, the DLLFB clock signal, is provided to a NAND gate 110f, along with the ENPD signal, only for the purpose of load matching the other NAND gates 110a-d of the arbiters 115, 117. Since only the DLLREF clock signal is propagated through the model arbiter 119, the output of the NAND gate 110f is floating (not connected).

The model arbiter 119 then generates a high LATCH signal on the rising edge of the CLKREF3. This high LATCH signal causes an enabled NAND gate 120c to output an active low clock signal that is further delayed by a delay line 113 that provides at most a delay $DL_3$ that is half the maximum period of the CLKREF1 clock signal. The total delay applied to the DLLREF signal is the delay $DL_1$ plus a delay that is at most half the period of the CLKREF1 clock signal, which ensures the latch occurs well after whichever clock signal is last to transition high. The delay line 113 outputs a delayed active low clock signal PDCLK*, which causes the outputs of the NAND gates 120a,b to be stored in a latch 125. The latch 125 generates a high SHIFT-L signal responsive to a low at the output of the NAND gate 120a, and it generates a high SHIFT-R signal responsive to a low at the output of the NAND gate 120b. If the outputs of both NAND gates 120a,b are high, which is indicative of a phase different that is less than the hysteresis window, neither the SHIFT-L nor the SHIFT-R signal is high. The SHIFT_L and SHIFT_R signals are typically control signals for adding or removing delays to adjust the phase of the DLLFB clock signal to reduce the difference between the phase of the DLLREF clock signal and the phase of the DLLFB clock signal.

Although the two-arbiter phase detector 100 is generally reliable for DLL designs that use conventional clock speeds, there is a greater need for extremely accurate, faster phase detectors as higher clock frequencies are used. Each arbiter and each delay line of the phase detector 100 individually requires power and space to operate. Therefore, the phase detector 100 consumes excessive amounts of total power and chip space due to the multiple arbiters and delay lines included in the design.

Another limitation of the phase detector 100 is that, in many cases, particularly when the DLLREF and DLLFB clock signals are close in phase the phase detector 100 outputs a SHIFT_L or SHIFT_R output well after the time that the arbiters 115, 117 have been able to output phase decision signals. This delay in providing phase decision output signals results from the relatively long delay $DL_3$ that the delay line 113 must provide to ensure that the outputs of the arbiters 115, 117 are not latched until both the DLLREF and DLLFB delayed by the delay lines 112 have transitioned high. This delay must be sufficient for "worst case" conditions that are as long as one-half period of the lowest frequency clock signal that will be applied to the phase detector 100. However, in many cases, the rising edge of the DLLFB clock signal will lag the DLLREF clock signal by far less than one-half period, or the clock signal will have a frequency that is far higher than the lowest frequency clock signal with which the phase detector 100 is designed to operate. In such case, the arbiters 115, 117 output phase decision signals as soon as the CLKREF and CLKFB signals delayed by the delay lines 112 have transitioned high. However, the resulting phase decision signals are not latched to provide the SHIFT_L and SHIFT_R signals from the latch 125 until well afterward. This delay in providing the SHIFT_L and SHIFT_R signals slows the operation of the phase detector 100. For example, if the phase detector 100 is used in a delay-lock loop (not shown), the slower operation of the phase detector 100 results in a delay in taking action to correct phase errors in the loop.

Other phase detectors have been designed using D-flip-flops instead of arbiters to reduce power consumption and use of chip space. However, because D-flip-flop have different setup and hold paths than of the arbiter-based systems, the phase detector has a tendency to exhibit phase bias, which may be regarded as a form of hysteresis. At high clock frequencies, the presence of phase bias or hysteresis in the phase detection increases the overall likelihood of phase detector error.

Therefore, there is a need for a highly accurate phase detector circuit operable to provide phase decisions without the effects of hysteresis or phase bias, and that does not rely on excessive delay lines or arbiters, thereby enabling a reduction in the overall size of the circuit and the consumption of power and chip space.

DETAILED DESCRIPTION

Embodiments of the present invention are directed to phase detection circuits capable of providing highly accurate phase detection, and methods of operation thereof as well as devices and systems including such circuits. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
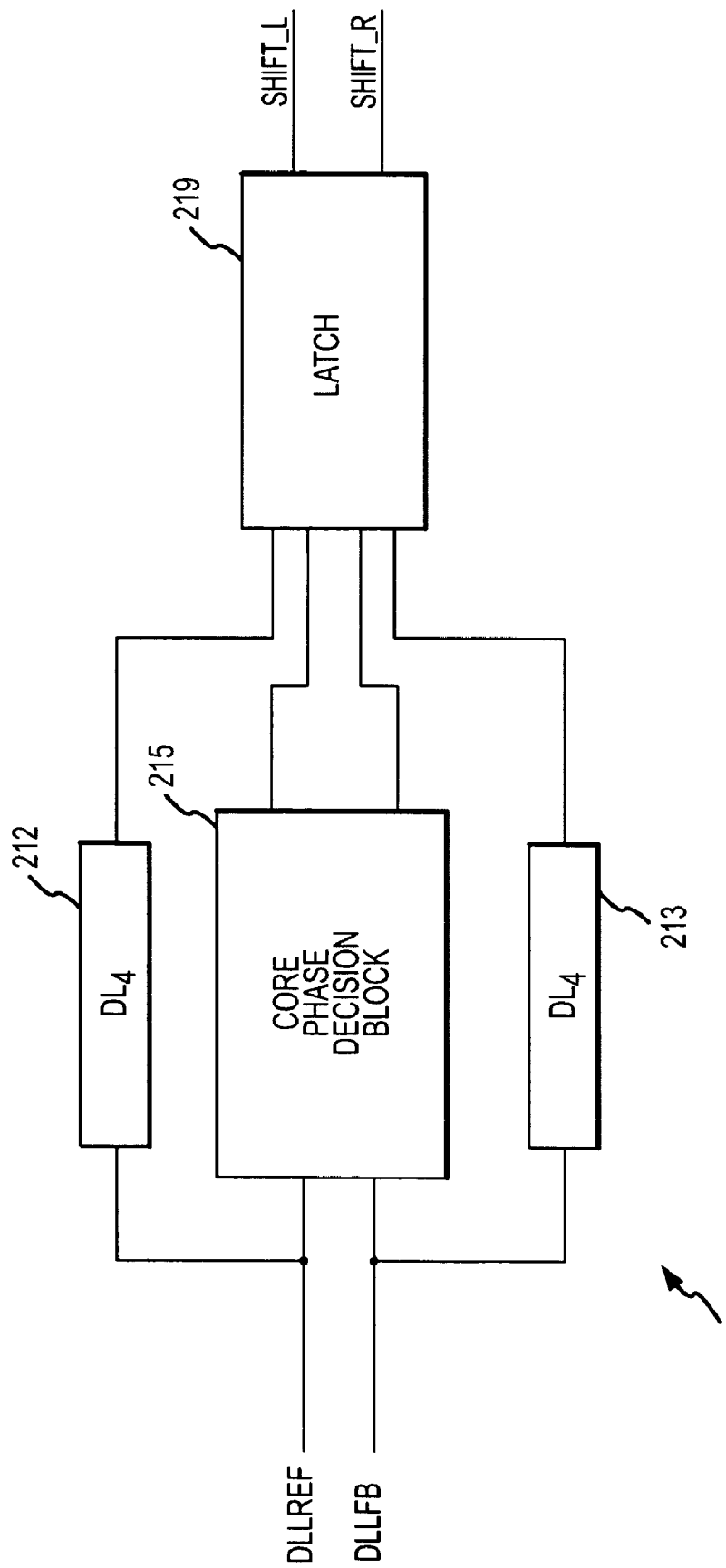
FIG. 2 is a block diagram of a phase detector circuit according to an embodiment of the invention.

FIG. 2 shows an embodiment of a phase detector circuit 200 according to an embodiment of the invention. The phase detector circuit 200 receives two input clock signals DLLREF and DLLFB and, upon comparing the phase difference of the two input clock signals, the phase detector circuit 200 outputs one of two output clock signals SHIFT_R or SHIFT_L as HIGH. The SHIFT_R signal and the SHIFT_L signal are complimentary select signals provided to a phase dependent signal source that may be implemented to use the select signals in a variety of circuit designs known to one skilled in the art. For example, the SHIFT_R signal may be provided to a shift register of a DLL circuit for adjusting a delay line to add a delay, and the SHIFT_L signal may be provided to the shift register for adjusting a delay line to remove a delay.

Figure 1:
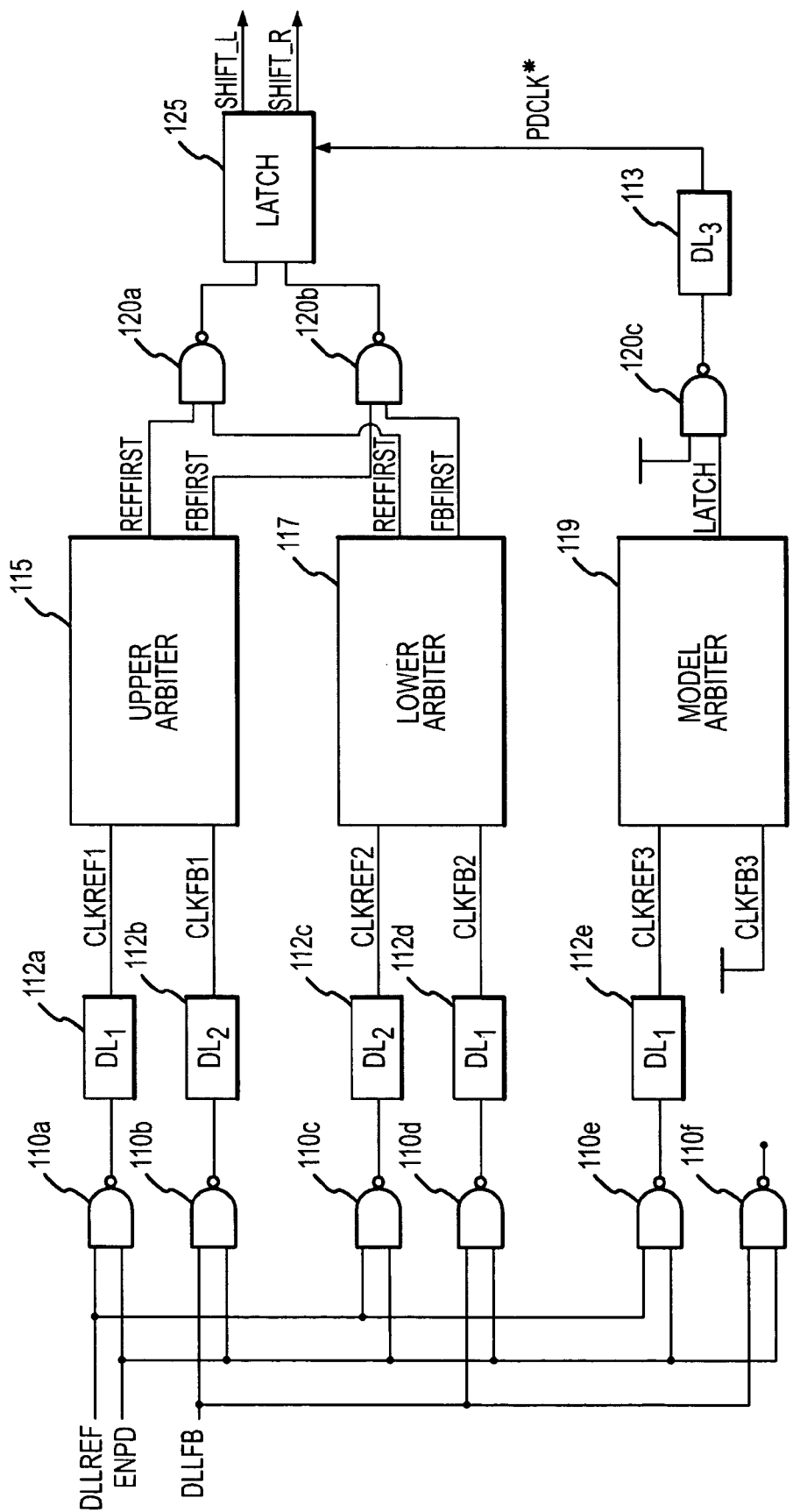
FIG. 1 is a block diagram of a conventional two-arbiter phase detector circuit using a third arbiter for generating a clock signal.

The phase detector circuit 200 includes a core phase decision block 215 that receives both the DLLREF clock signal and the DLLFB clock signal, and determines the phase difference between the two clock signals. The core phase decision block 215 detects which signal is received first to make a decision whether to add delay or remove delay relative to the other received signal, and generates logic output signals representative of the comparison. The logic output signals are provided to a latch circuit 219 to sample and hold the decision of the core phase decision block 215. Two delay lines 212, 213 that run parallel to the phase decision block 215 also receive the DLLREF and DLLFB clock signals, respectively. Similar to the phase detector 100 of FIG. 1, a matched clock signal is required to properly time the latch of the phase decision after the core phase decision block 215 makes its decision. The phase detector circuit 200 delays both the DLLREF and the DLLFB clock signals by an equal amount $DL_4$, and latches the phases decision as soon as both of the delayed DLLREF and the DLLFB clock signals have transitioned high. As a result, the SHIFT_L and SHIFT_R signals can be generated almost as soon as both delayed DLLREF and the DLLFB clock signals have transitioned high rather than waiting a fixed period corresponding to "worst case" conditions before latching the phase decision signals at the output of the core phase decision block 215 as in the prior art phase detector 100 of FIG. 1. Since the phase decision block 215 can change on both the rising and falling edges of the clock signals, the latch circuit 219 of this particular embodiment is designed to sample and hold the phase decision after both the DLLREF and the DLLFB signals are high. Therefore, the latch circuit 219 is designed to be clocked by only the last clock signal that transitions high provided by either of the delay lines 212, 213. The latch circuit 219 may alternatively be designed to sample and hold the phase decisions when both clock signals are transitioned low, or to sample and hold the phase decisions when both clock signals have transitioned both high and low. The latch circuit 219 holds the output state of the phase decision block 215, and generates the SHIFT_L and SHIFT_R control signals for adjusting the phase of the DLLFB clock signal to reduce the phase difference between the DLLREF and DLLFB clock signals, as previously described.

In summary, since the phase decision of the core phase decision block 215 can be latched when the last received clock signal transitions high and is delayed by $DL_4$, the need to provide an overcompensated delay that consumes excess power and adds unnecessary delay is eliminated. Hysteresis is removed since a "hysteresis window" is not needed, and the delay lines 112a-e are replaced by the two delay lines 212, 213. Additionally, the overall size of the phase detector circuit 200 is reduced, thereby also reducing power consumption, by having only the two delay lines 212, 213 and the single core phase decision circuit 215 that replaces the three arbiters 115, 117, 119 of FIG. 1. Therefore, the phase detector 200 provides a highly accurate phase decision at a faster rate, and at less expense in terms of size and power consumption.

Figure 3:
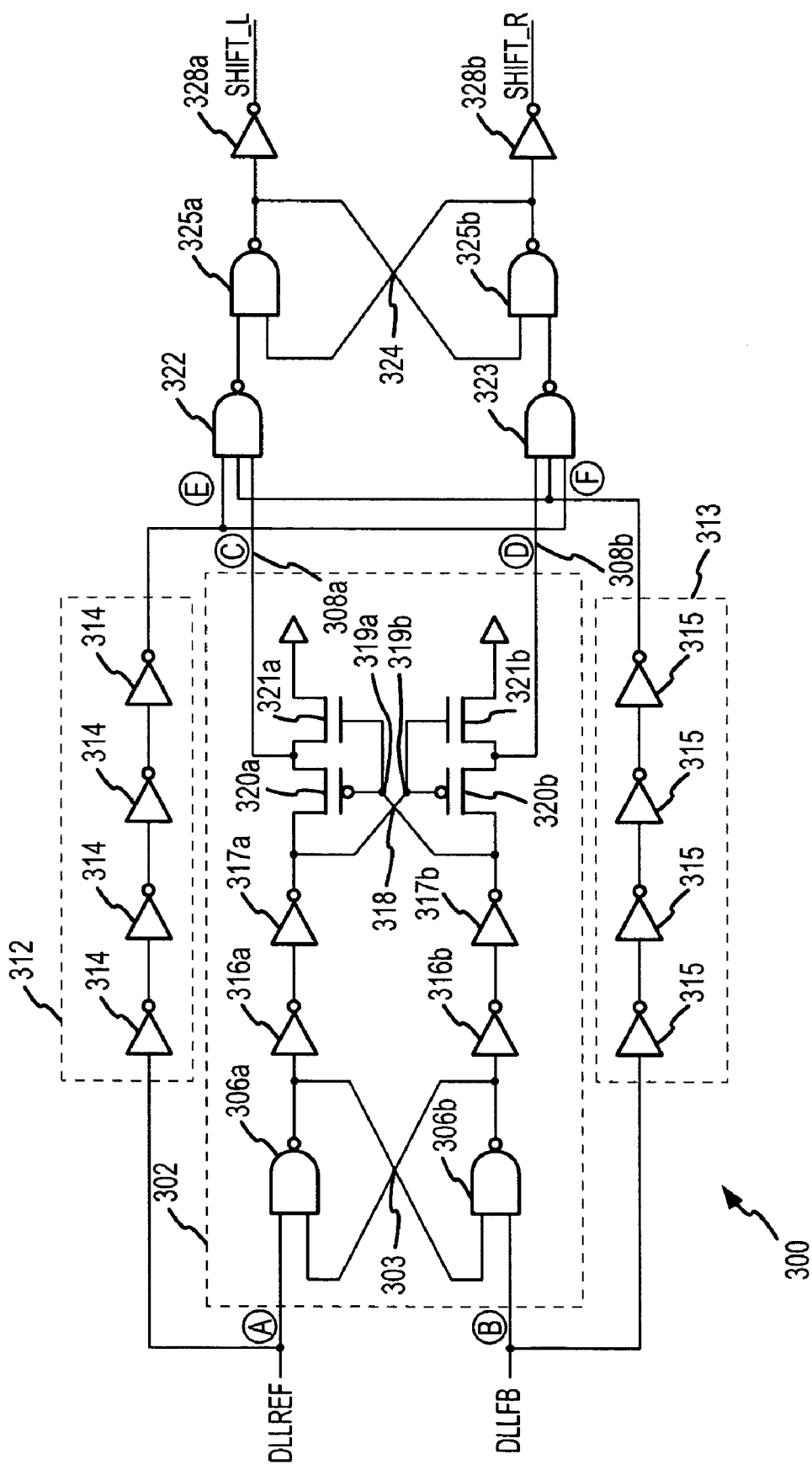
FIG. 3 is a block diagram of a phase detector circuit according to an embodiment of FIG. 2.

FIG. 3 illustrates an embodiment of the phase detector circuit 200 in greater detail. The phase detector circuit 300 includes an arbiter 302 that receives the DLLREF and DLLFB clock signals for detecting the phase difference between the two clock signals. The arbiter 302 includes a dual output latch 303 having a pair of cross-coupled NAND gates 306a,b. The DLLREF and DLLFB clock signals are received as inputs to the NAND gate 306a and the NAND gate 306b, respectively. The inputs to the NAND gates 306a,b are initially low, causing both of the NAND gates 306a,b to output a high signal. In this condition, the latch 303 is in an indeterminate unstable state in which it is neither set nor reset. The first signal to transition high, i.e., either DLLREF or DLLFB, places the latch 303 in either a set or reset state. When the DLLREF or DLLFB signal transitions high, the phase detector circuit 300 can determine that such signal leads the other signal, DLLREF or DLLFB, that has not yet transitioned high. The latch 303 remains in this state even when the other signal, DLLREF or DLLFB, transitions high because the low at the output of the NAND gate 306a or b will maintain the output of the other NAND gate 306a or b high even when the other signal transitions high.

Each of the outputs to the NAND gate 306a,b are coupled to an inverter 316a,b, which is coupled in series to another inverter 317a,b. The inverter 316a,b and the inverter 317a,b reduces the load to the outputs of the latch 303 and improves the gain for improving the accuracy of the arbiter 302. While the arbiter 302 is one example of an embodiment for the core phase decision block 215 of FIG. 2, a number of designs may be implemented as known to one skilled in the art. The signals received from the outputs of the NAND gate 306a,b are slightly delayed as the signals are propagated through the inverter 316a,b and the inverter 317a,b.

The output signals from the inverters 317a,b are applied to a pass-gate 318 that includes PMOS transistors 320a,b and NMOS transistors 321a,b. By coupling the pass-gate 318 to the outputs of the NAND gates 306a, b, the pass-gate 318 can be viewed as an inverter that is powered by the latch 303 instead of a separate supply voltage, which ensures that the nodes 306a and b cannot be high at the same time. When the inverter 317a outputs a high signal, the PMOS transistor 320b turns OFF and the NMOS transistor 321b turns ON, causing an output node 308b to be coupled to ground and providing a low signal to the input of a NAND gate 323. Inversely, when the inverter 317a outputs a low signal, the PMOS transistor 302b turns ON and the NMOS transistor 321b turns OFF, causing the output node 308b to be coupled to the output signal of the inverter 317b, which is typically a high signal in such conditions. The PMOS transistor 320a and the NMOS transistor 321a respond in the same manner to the output signal of the inverter 317b to provide a logic signal to the input of a NAND gate 322 at an output node 308a. The signals applied to the NAND gates 322, 323 are the phase decision signals from the arbiter 302.

The phase detector circuit 300 also includes two delay lines 312, 313, each of which run parallel along opposite sides of the arbiter 302. The delay line 312 is formed by having four inverters 314 cascaded in series to each other. Similarly, the delay line 313 has four inverters 315 cascaded in series to each other. The delay line 312 is coupled to receive the DLL- REF signal and apply a total delay on the clock signal that is the sum of delays provided by each inverter 314. The delay line 313 is coupled to receive the DLLFB signal and applies a total delay that is the sum of the delays by inverters 315. Each of the delay lines 312, 313 is designed to provide a total delay that is slightly greater than the time required by the arbiter 302 to make a phase determination. High outputs from the delay lines 312, 313 enable the NAND gates 322, 323 to pass the phase decision signals from the arbiter 302. The delays provided by the delay lines 312, 313 thus ensure the arbiter 302 has made a phase decision before signals indicative of the decision are coupled to the outputs of the NAND gates 322, 323. Insofar as the delay lines 312, 313 provide a delay that is only slightly greater than the time required by the arbiter 302 to make a phase determination, the phase decision signals are output from the NAND gates 322, 323 almost as soon as the arbiter 302 has made its phase decision.

The phase decision signals at the outputs of the NAND gates 322, 323 are applied to a second dual output latch 324 formed by a pair of cross-coupled NAND gates 325a,b. The latch 324 is set by a low at the output of the NAND gate 322 to cause the NAND gate 325a to output a high logic signal and the NAND gate 325b to output a low logic signal. This high logic signal at the output of the NAND gate 325a is coupled through an inverter 328a to generate a low SHIFT-L signal. At the same time, the low logic signal at the output of the NAND gate 325b is coupled through an inverter 328b to generate a high SHIFT-R signal.

In operation, assume the DLLREF and DLLFB clock signals are initially low, applying low signals to the inputs of the NAND gates 306a,b and to the delay lines 312, 313, respectively. Thus, both of the NAND gates 306a,b initially output a high signal. The inverters 317a,b correspondingly output high signals. When the signals are high the outputs of the inverters 317a,b, the PMOS transistors 320a,b are turned OFF, and the NMOS transistors 321a,b are turned ON, providing low output signals to the NAND gates 322, 323. The NAND gates 322, 323 consequently provide high signals to the inputs of the latch 324. Thus, one of the NAND gates 325a or b outputs a high signal and the other outputs a low signal depending on whether the latch 324 is initially set or reset.

As previously explained, the phase detector 300 is designed to latch the phase decision of the arbiter 302 when both the DLLREF and the DLLFB clock signals are transitioned high. Assume the DLLREF clock signal transitions high before the DLLFB clock signal transitions high. The NAND gate 306a and the delay line 312 are the first to receive a signal transitioning high. Since the cross-coupled output signal of the NAND gate 306b is already high, both of the inputs to the NAND gate 306a are consequently high causing the output signal of the NAND gate 306a to transition low. In response, the inverter 317a provides a low signal to the node 319b, which turns ON the PMOS transistor 320b and turns OFF the NMOS transistor 321b causing the output at node 308b to transition HIGH. However, only two of the input signals to the NAND gate 323 transitions high, due the HIGH output signal at the node 308b and transition high of the DLLREF signal coupled through the delay line 312. The third input coupled to the second delay line 313 remains low since the DLLFB clock signal has not yet transitioned high. Therefore, the output of the NAND gate 323 maintains the same high signal and the latch 324 is not changed.

When the DLLFB clock signal transitions high, the inputs to the NAND gate 306b and the delay line 313 both transition high. Since the output of the NAND gate 306a is a low signal coupled to the input of the NAND gate 306b, the NAND gate 306b maintains the high output signal regardless of receiving the high input signal due to the DLLFB clock signal transitioning high. Therefore, there is no change to the output signals of the latch 303, and consequently the output at node 308a maintains a low signal. However, since the delay line 313 outputs a high signal in response to receiving the DLLFB clock signal transitioning high, the third input to the NAND gate 323 also transitions high, making the signals to all three inputs high and causing the NAND gate 323 output to transition low. The NAND gate 325b receives the low signal, and the latch 324 may flip depending on whether the latch 324 was previously set or reset. In either case, the NAND gate 325a will then output a low logic signal and the NAND gate 325b will output a high logic signal to make the SHIFT_L signal inactive high and the SHIFT_R signal active low. Thus, if the DLLREF signal leads the DLLFB signal, the phase detector 300 will output an active low SHIFT_R signal. In the same manner, if the DLLREF signal lags the DLLFB signal, the phase detector 300 will output an active low SHIFT_L signal.

Figure 4:
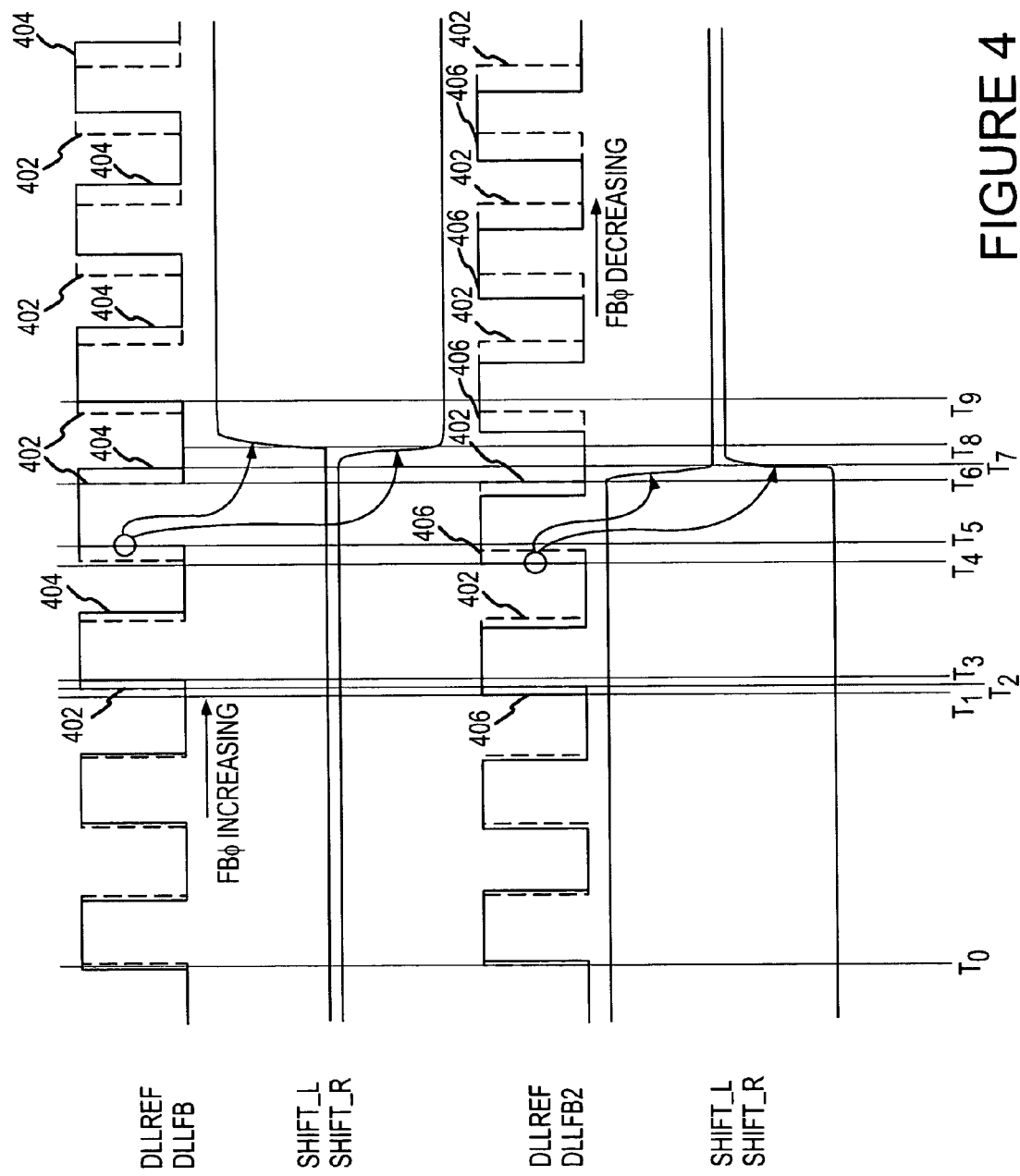
FIG. 4 is a timing diagram of various signals during the latching operation of the phase detector circuit according to an embodiment of FIG. 3.
Figure 5:
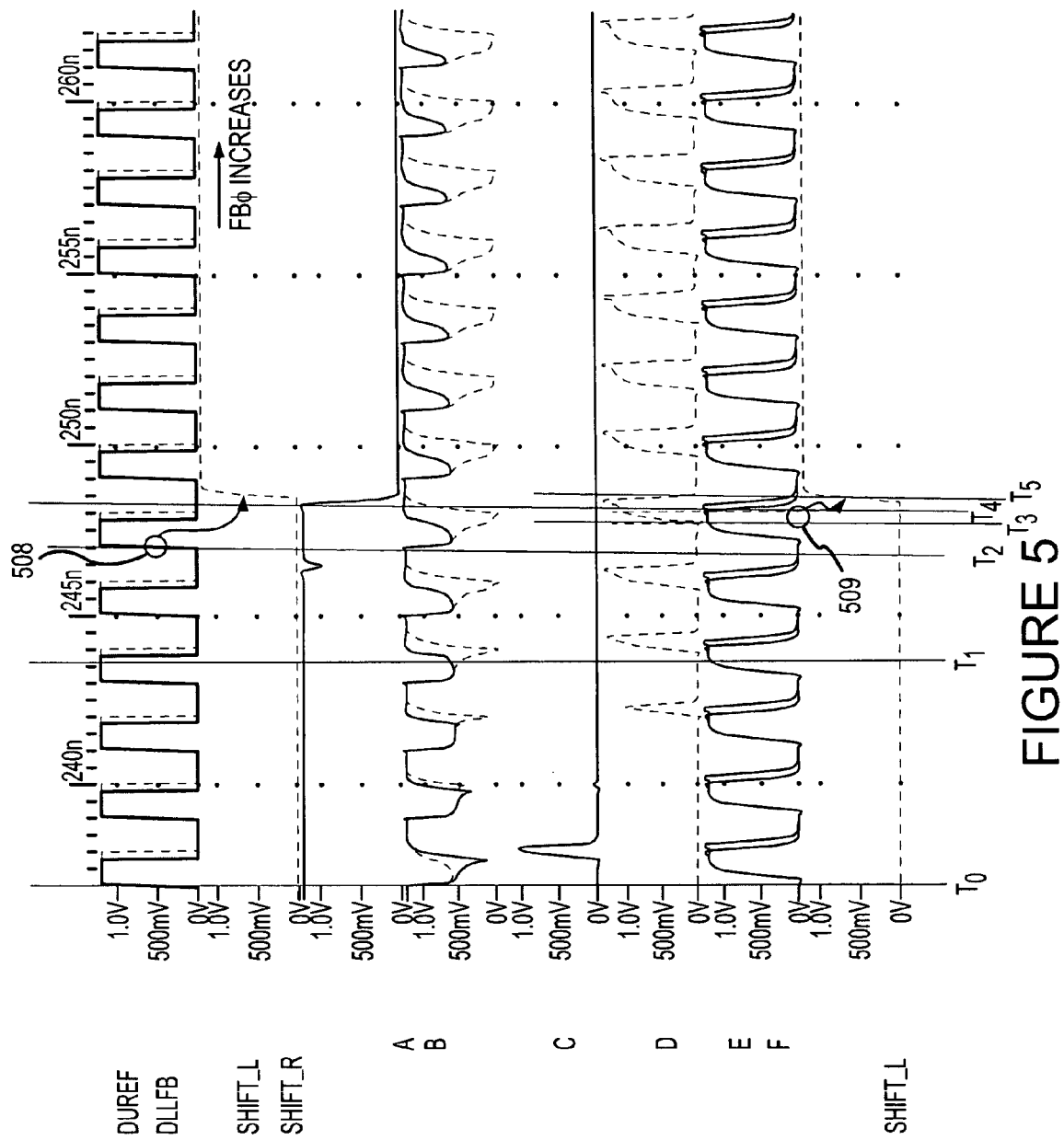
FIG. 5 is a timing diagram of various signals during operation of the phase detector circuit according to an embodiment of FIG. 3.

Timing diagrams are shown in FIGS. 4 and 5 to further demonstrate the operation of the phase detector circuit 300. FIG. 4 illustrates how the phase detector circuit 300 provides a more accurate hold time irrespective of whether the phase ϕ increases or decreases. In the first case, a DLLFB clock signal 404 lags a DLLREF clock signal 402. At time T0, the DLLREF clock signal 402 and the DLLFB clock signal 404 have the approximately the same phase. The phase of the DLLFB clock signal 404, however, shifts such that, at time T2 and T3, the DLLFB clock signal 404 lags the DLLREF clock signal 402. The phase detector circuit 300 therefore receives the rising edge of the DLLREF clock signal 402 first. The phase detector circuit 300 generates a SHIFT_L signal transitioned high and a SHIFT_R signal transitioned low at approximately time T8 in response to the rising edge of the DLLFB signal 402 at time T5, after some delay between T5 and T8. The phase detector 300 then holds the SHIFT_L and SHIFT_R signals as shown at time T9. In the second case, the DLLFB2 clock signal 406 leads the same DLLREF clock signal 404. At time T0, the DLLREF clock signal 402 and the DLLFB2 clock signal initially have approximately the same phase. The phase of the DLLFB2 signal 406 decreases such that, at time T1 and T2, the DLLREF clock signal 402 lags the DLLFB2 clock signal 406. In response to phase detector circuit 300 receiving the rising edge of the DLLFB signal 406 at time T4, the phase detector circuit 300 generates the SHIFT_L signal transitioning low and the SHIFT_R signal transitioning high at T7, after some delay between times T4 and T7. The phase detector circuit 300 then holds the respective states of the SHIFT_L and SHIFT_R signals as shown at time T9. As shown, the SHIFT_L and SHIFT_R signals are asserted at approximately the same clock period between times T6 and T9 in both cases. The phase detector circuit 300 is capable of determining the phase difference of two clock signals and providing control signals regardless of whether the phase of the clock signals are increasing or decreasing. Therefore, the accuracy of the phase detector circuit 300 is greatly enhanced due to the output signals being asserted only by the rising edge of the respective clock signals and at approximately the same time, without the effects of any hysteresis.

The timing diagram of FIG. 5 further illustrates the complete operation of the phase detector circuit 300 as it holds a phase decision represented by the high SHIFT_L signal. The inputs to the phase detector circuit 300 are shown in the first timing diagram and the outputs are shown in the second timing diagram. The first and second timing diagrams show the same inputs and outputs as the timing diagrams of the first case of FIG. 4, where the phase increase of the DLLFB clock signal causes the DLLFB clock signal to lag relative to the DLLREF clock signal. The SHIFT_L signal is asserted high and the SHIFT_R signal is asserted low at time T4 in response to the rising edge of the DLLREF and DLLFB signals at time T2 indicated by an arrow 508. Signals A-F are interim signals generated at various points in the phase detector circuit 300, and are correspondingly labeled nodes A-F in FIG. 3. At time T0, the DLLREF and the DLLFB clock signals are received by the first latch 303 of the arbiter 302, and are labeled signals A and B.

The latch 303 initially generates unstable signals A and B as indicated by the metastability occurring between times T0 and T1, where the logic states of the signals are not well-defined. Such instability results in errors to the phase decision and the final outputs of the phase detector circuit 300. As described, the cross-coupled inverters 318 are powered by the output signals of the latch 303 to ensure the signals cannot be both high at the same time, and therefore removing the metastability from arbiter 302 output signals as shown by signals C and D. The C signal corresponds to the DLLFB clock signal and the D signal corresponds to the leading DLLREF clock signal. While the arbiter 302 may be designed to internally remove metastability, it cannot prevent the output signal from toggling as shown by the response of the D signal starting from time T1. As described, the NAND gates 322, 323 and the second latch 324 operate together to hold the decision of the arbiter 302 exhibited on the rising edge of the D signal occurring after the rising edge of the received DLLREF clock signal at time T2. The delay lines 312, 313 provide a delayed clock signals E and F to the NAND gates 322, 323. Due to the applied delay, the E and F signals are closely synchronized to the D signal outputted by the arbiter 302. At time between T3 and T4, the rising edge of the delayed clock signals E and F are synchronized to the rising edge of the D signal. In response to the rising of the delayed clock signals E and F, the NAND gate 322, 232 outputs a signal to the latch 324 to latch the logic signal matched to the rising edge of the D signal, thereby generating the SHIFT_L signal transitioning high at time T5, indicated by an arrow 509.

Figure 6:
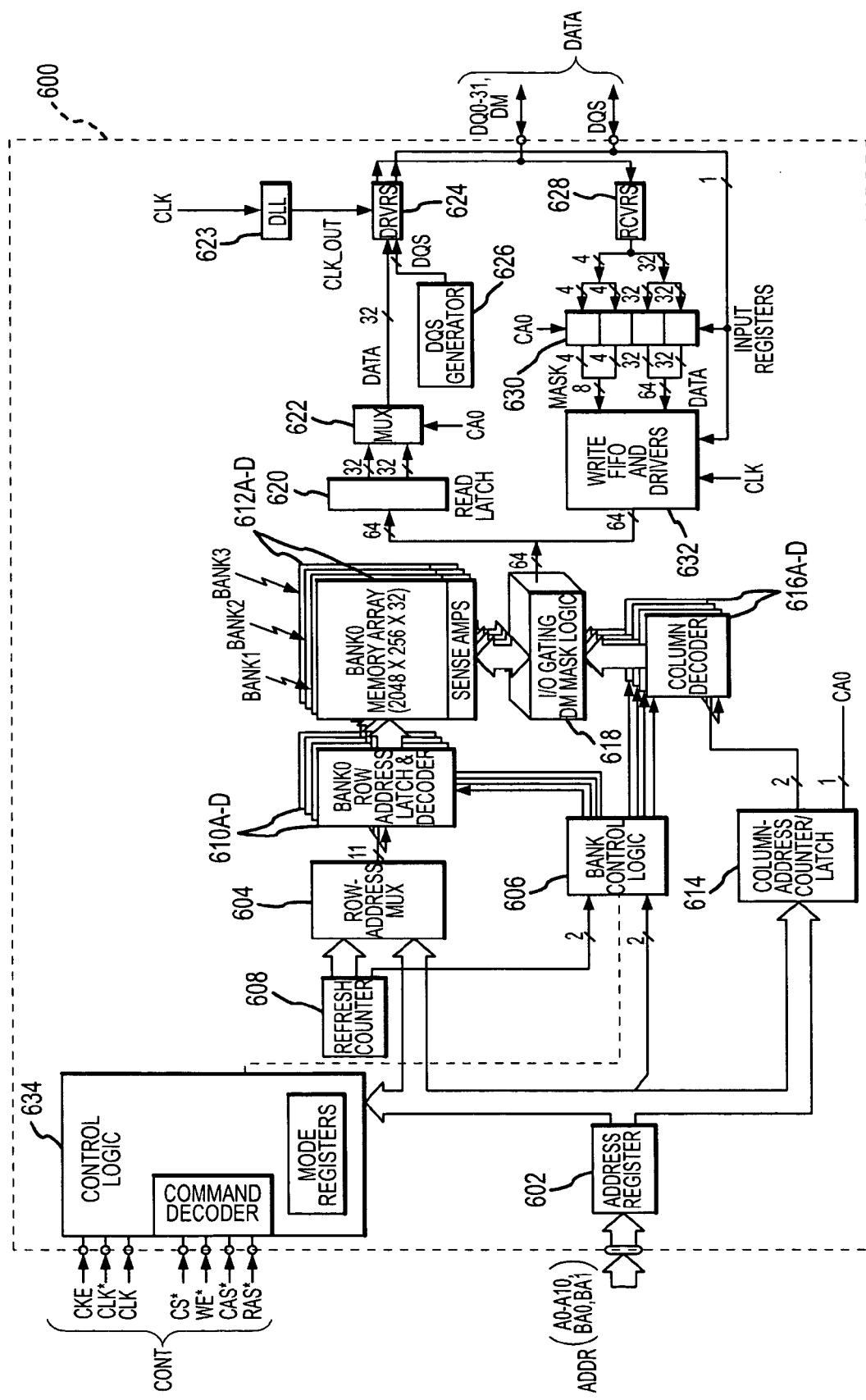
FIG. 6 is a functional block diagram illustrating a memory device including a phase detector circuit according to an embodiment of the invention.

FIG. 6 is a functional block diagram of a memory device 600 including a clock generator 623 that includes a phase detector 300 according to an embodiment of the present invention. The memory device 600 in FIG. 6 is a double-data rate ("DDR") SDRAM, although the principles described herein are applicable to any memory device that may include a delay-locked loop for synchronizing internal and external signals, such as conventional SDRAMs, as well as packetized memory devices like SLDRAMs and RDRAMs, and are equally applicable to any integrated circuit that must synchronize internal and external clocking signals.

The memory device 600 includes an address register 602 that receives row, column, and bank addresses over an address bus ADDR, with a memory controller (not shown) typically supplying the addresses. The address register 602 receives a row address and a bank address that are applied to a row address multiplexer 604 and bank control logic circuit 606, respectively. The row address multiplexer 604 applies either the row address received from the address register 602 or a refresh row address from a refresh counter 608 to a plurality of row address latch and decoders 610A-D. The bank control logic 606 activates the row address latch and decoder 610A-D corresponding to either the bank address received from the address register 602 or a refresh bank address from the refresh counter 608, and the activated row address latch and decoder latches and decodes the received row address. In response to the decoded row address, the activated row address latch and decoder 610A-D applies various signals to a corresponding memory bank 612A-D to thereby activate a row of memory cells corresponding to the decoded row address. Each memory bank 612A-D includes a memory-cell array having a plurality of memory cells arranged in rows and columns, and the data stored in the memory cells in the activated row is stored in sense amplifiers in the corresponding memory bank. The row address multiplexer 604 applies the refresh row address from the refresh counter 608 to the decoders 610A-D and the bank control logic circuit 606 uses the refresh bank address from the refresh counter when the memory device 600 operates in an auto-refresh or self-refresh mode of operation in response to an auto- or self-refresh command being applied to the memory device 600, as will be appreciated by those skilled in the art.

A column address is applied on the ADDR bus after the row and bank addresses, and the address register 602 applies the column address to a column address counter and latch 614 which, in turn, latches the column address and applies the latched column address to a plurality of column decoders 616A-D. The bank control logic 606 activates the column decoder 616A-D corresponding to the received bank address, and the activated column decoder decodes the applied column address. Depending on the operating mode of the memory device 600, the column address counter and latch 614 either directly applies the latched column address to the decoders 616A-D, or applies a sequence of column addresses to the decoders starting at the column address provided by the address register 602. In response to the column address from the counter and latch 614, the activated column decoder 616A-D applies decode and control signals to an I/O gating and data masking circuit 618 which, in turn, accesses memory cells corresponding to the decoded column address in the activated row of memory cells in the memory bank 612A-D being accessed.

During data read operations, data being read from the addressed memory cells is coupled through the I/O gating and data masking circuit 618 to a read latch 620. The I/O gating and data masking circuit 618 supplies N bits of data to the read latch 620, which then applies two N/2 bit words to a multiplexer 622. The circuit 618 provides 64 bits to the read latch 620 which, in turn, provides two 32 bits words to the multiplexer 622. A data driver 624 sequentially receives the N/2 bit words from the multiplexer 622 and also receives a data strobe signal DQS from a strobe signal generator 626 and an adjusted clock signal CLK_OUT from the clock generator 623. The DQS signal is used by an external circuit such as a memory controller (not shown) in latching data from the memory device 600 during read operations. In response to the CLK_OUT signal, the data driver 624 sequentially outputs the received N/2 bits words as a corresponding data word DQ, each data word being output in synchronism with rising and falling edges of the CLK or CLK* signals that are applied to clock the memory device 600. The data driver 624 also outputs the data strobe signal DQS having rising and falling edges in synchronism with rising and falling edges of the CLK or CLK* signals. Each data word DQ and the data strobe signal DQS collectively define a data bus DATA. As will be appreciated by those skilled in the art, the CLK_OUT signal from the DLL are delayed versions of the CLK or CLK* signals, and the clock generator 623 adjusts the delay of the CLK_OUT signal relative to the CLK or CLK* signals to ensure that the DQS signal and the DQ words are placed on the DATA bus in synchronism with the CLK or CLK* signals, as previously described. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 628 receives each DQ word and the associated DM signals, and applies these signals to input registers 630 that are clocked by the DQS signal. In response to a rising edge of the DQS signal, the input registers 630 latch a first N/2 bit DQ word and the associated DM signals, and in response to a falling edge of the DQS signal the input registers latch the second N/2 bit DQ word and associated DM signals. The input register 630 provides the two latched N/2 bit DQ words as an N-bit word to a write FIFO and driver 632, which clocks the applied DQ word and DM signals into the write FIFO and driver in response to the DQS signal. The DQ word is clocked out of the write FIFO and driver 632 in response to the CLK signal, and is applied to the I/O gating and masking circuit 618. The I/O gating and masking circuit 618 transfers the DQ word to the addressed memory cells in the accessed bank 612A-D subject to the DM signals, which may be used to selectively mask bits or groups of bits in the DQ words (i.e., in the write data) being written to the addressed memory cells.

A control logic and command decoder 634 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active LOW. The command signals CS*, WE*, CAS*, and RAS* are driven to values corresponding to a particular command, such as a read, write, or auto-refresh command. In response to the clock signals CLK, CLK*, the command decoder 634 latches and decodes an applied command, and generates a sequence of clocking and control signals that control the components 602-632 to execute the function of the applied command. The clock enable signal CKE enables clocking of the command decoder 634 by the clock signals CLK, CLK*. The command decoder 634 latches command and address signals at edges of the CLK, CLK* signals (i.e., the crossing point of CLK going HIGH and CLK* going LOW), while the input registers 630 and data drivers 624 transfer data into and from, respectively, the memory device 600 in response to both edges of the data strobe signal DQS and thus at double the frequency of the clock signals CLK, CLK*. This is true because the DQS signal has the same frequency as the CLK, CLK* signals. The memory device 600 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 634 in generating the control and timing signals is conventional, and thus, for the sake of brevity, will not be described in more detail.

Figure 7:
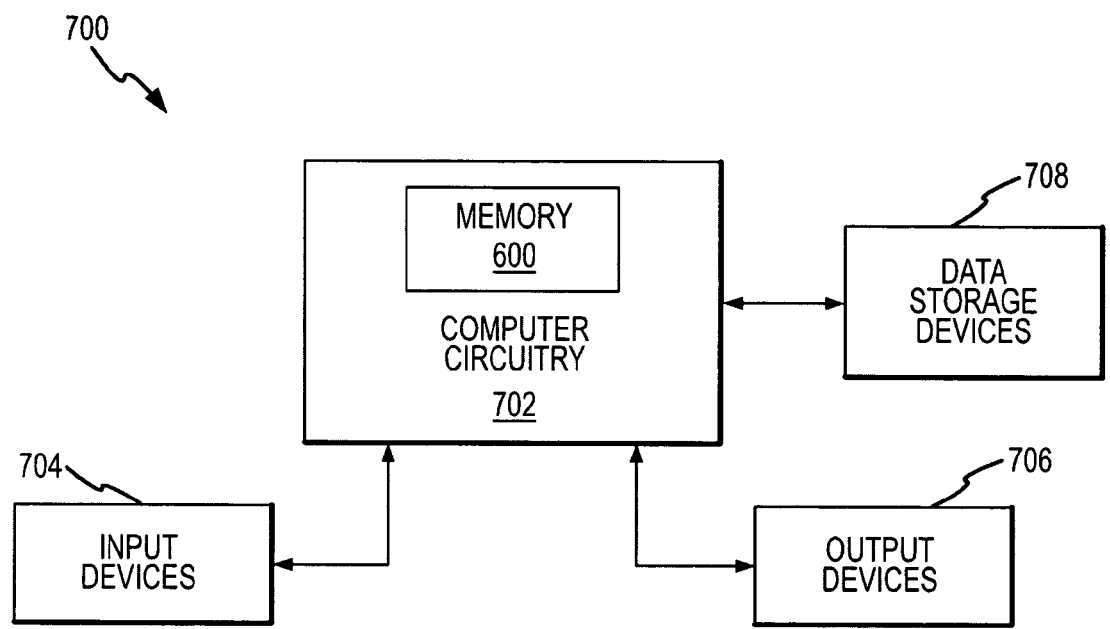
FIG. 7 is a functional block diagram illustrating a system including the memory device of FIG. 6.

FIG. 7 is a block diagram of a processor-based system 700 including processor circuitry 702, which includes the memory device 600 of FIG. 6. Examples of the processor-based system 700 includes computers and other programmable devices, but also systems other than computers such as phones, PDA's and other hand-held devices, wireless communication devices, controllers, cameras and so on. Conventionally, the processor circuitry 702 is coupled through address, data, and control buses to the memory device 600 to provide for writing data to and reading data from the memory device. The processor circuitry 702 includes circuitry for performing various processing functions, such as executing specific software to perform specific calculations or tasks. In addition, the processor-based system 700 includes one or more input devices 704, such as a keyboard or a mouse, coupled to the processor circuitry 702 to allow an operator to interface with the processor-based system 700. The processor-based system 700 may also include one or more output devices 706 coupled to the processor circuitry 702, such as output devices typically including a printer and a video terminal. One or more data storage devices 708 may also be coupled to the processor circuitry 702 to store data or retrieve data from external storage media (not shown). Examples of conventional storage devices 708 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. For example, many of the components described above may be implemented using either digital or analog circuitry, or a combination of both. Accordingly, the invention is not limited except as by the appended claims.

What is claimed is:

1. A circuit comprising:
   a phase decision circuit having first and second inputs coupled to receive first and second clock signals, respectively, the phase decision circuit operable to determine a phase relationship between the first and second clock signals and to provide a first logic signal corresponding to the determined phase relationship;
   a latch circuit coupled to the phase decision circuit, the latch circuit operable to store the logic state of the first logic signal responsive to a predetermined transition of both a first delayed clock signal and a second delayed clock signal; and
   a first delay line coupled to the first input terminal to receive the first input clock signal and a second delay line coupled to the second input terminal to receive the second input clock signal, the first and second delay lines configured to generate and provide to the latch circuit the first delayed clock signal relative to the first input clock signal and the second delayed clock signal relative to the second input clock signal to cause the latch circuit to store the logic state of the first logic signal responsive to a predetermined transition of both the first and second delayed clock signals.

2. The circuit of claim 1 wherein the phase decision circuit comprises a latch having first and second inputs coupled to receive the first and second clock signals and having first and second outputs, the latch operable to be set in response to a rising edge of the first input clock signal occurring prior to a rising edge of the second input clock signal and being reset in response to a rising edge of the second input clock signal occurring prior to a rising edge of the first input clock signal the latch further operable to generate respective first and second output signals responsive to each set and reset response.

3. The circuit of claim 1 wherein the delays of the first and second delay lines provide respective delays that are approximately equal to a period of time required by the phase decision circuit to provide the first logic signal.

4. The circuit of claim 1 wherein the phase decision circuit is further operable to provide a second logic signal corresponding to the determined phase relationship, and wherein the latch circuit comprises a first three-input logic gate coupled to receive the first logic signal and a second three-input logic gate coupled to receive the second logic signal, each of the three-input logic gates further coupled to the first and second delay lines to receive the first and second delayed clock signals, the first three-input logic gate operable to generate a first logic hold signal responsive to the first logic signal and the delayed clock signals and the second three-input logic gate operable to generate a second logic hold signal responsive to the second logic signal and the delayed clock signals.

5. The circuit of claim 4 wherein the latch circuit further comprises a latch having first and second inputs coupled to receive the first and second logic hold signals respectively, and having first and second outputs, the latch operable to set in response receiving a first logic level of the first logic hold signal and reset in response receiving a first logic level of the second logic hold signal.

6. The circuit of claim 5 wherein the first latch comprises a pair of cross-coupled NAND gates.

7. A phase comparison circuit comprising:
a phase decision circuit coupled to receive at first and second input terminals respective first and second clock signals, the phase decision circuit operable to generate a first logic signal indicative of a phase relationship between a rising edge of the first clock signal and a rising edge of the second clock signal;
a first delay line coupled to the first input terminal to receive the first clock signal and a second delay line coupled to the second input terminal to receive the second clock signal, the first delay line configured to generate a first delayed clock signal relative to the first clock signal, the second delay line configured to generate a second delayed clock signal relative to the second clock signal, the first and second delay lines each providing a delay that is approximately equal to the time it takes the phase comparison circuit to generate the first logic signal; and
a latch circuit coupled to receive the first logic signal of the phase decision circuit and the first and second delayed clock signals of the first and second delay lines, the latch circuit operable to hold the logic state of the logic signal responsive to receiving a rising edge of both the first delayed clock signal and the second delayed clock signal, the latch circuit further operable to generate a delay control signal corresponding to the held logic state.

8. The phase comparison circuit of claim 7 wherein the phase decision circuit comprises a latch having first and second inputs coupled to receive the first and second clock signals and having first and second outputs, the latch operable to be set in response to a rising edge of the first input clock signal occurring prior to a rising edge of the second input clock signal and being reset in response to a rising edge of the second input clock signal occurring prior to a rising edge of the first input clock signal, the latch further operable to generate respective first and second output signals responsive to each set and reset response.

9. The phase comparison circuit of claim 7 further comprising a first delay line coupled to the first input terminal to receive the first input clock signal and a second delay line coupled to the second input terminal to receive the second input clock signal, the first and second delay lines configured to generate and provide to the latch circuit a first delayed clock signal relative to the first input clock signal and a second delayed clock signal relative to the second input clock signal, the latch circuit being operable to store the logic state of the first logic signal responsive to a predetermined transition of both the first and second delayed clock signals.

10. The phase comparison circuit of claim 9 wherein the respective delays of the first and second delay lines are approximately equal to a period of time required by the phase decision circuit to provide the first logic signal.

11. The phase comparison circuit of claim 9 wherein the phase decision circuit is further operable to provide a second logic signal corresponding to the determined phase relationship, and wherein the latch circuit comprises a first three-input logic gate coupled to receive the first logic signal and a second three-input logic gate coupled to receive the second logic signal, each of the three-input logic gates further coupled to the first and second delay lines to receive the first and second delayed clock signals, the first three-input logic gate operable to generate a first logic hold signal responsive to the first logic signal and the delayed clock signals and the second three-input logic gate operable to generate a second logic hold signal responsive to the second logic signal and the delayed clock signals.

12. The phase comparison circuit of claim 11 wherein the latch circuit further comprises a latch having first and second inputs coupled to receive the first and second logic hold signals respectively, and having first and second outputs, the second latch operable to set in response receiving a first logic level of the first logic hold signal and reset in response receiving a first logic level of the second logic hold signal.

13. A memory device comprising:
an address bus;
a control bus;
a data bus;
an address decoder coupled to the address bus;
a read/write circuit coupled to the data bus;
a control circuit coupled to the control bus;
an array of memory cells coupled to the address decoder, control circuit, and read/write circuit; and
a clock generator coupled to the control circuit, the clock generator including a phase detection circuit comprising:
a phase decision circuit having first and second input coupled to receive first and second clock signals, respectively, the phase decision circuit operable to determine a phase relationship between the first and second clock signals and to provide a first logic signal corresponding to the determined phase relationship;
a latch circuit coupled to the phase decision circuit, the latch circuit operable to store the logic state of the first logic signal responsive to a predetermined transition of both a first delayed clock signal and a second delayed clock signal; and
a first delay line coupled to the first input terminal to receive the first input clock signal and a second delay line coupled to the second input terminal to receive the second input clock signal, the first and second delay lines configured to generate and provide to the latch circuit the first delayed clock signal relative to the first input clock signal and the second delayed clock signal relative to the second input clock signal to cause the latch circuit to store the logic state of the first logic signal responsive to a predetermined transition of both the first and second delayed clock signals.

14. The memory device of claim 13 wherein the phase decision circuit comprises a latch having first and second inputs coupled to receive the first and second clock signals and having first and second outputs, the latch operable to be set in response to a rising edge of the first input clock signal occurring prior to a rising edge of the second input clock signal and being reset in response to a rising edge of the second input clock signal occurring prior to a rising edge of the first input clock signal, the latch further operable to generate respective first and second output signals responsive to each set and reset response.

15. The memory device of claim 14 wherein the first latch comprises a pair of cross-coupled NAND gates.

16. The memory device of claim 13 wherein the respective delays of the first and second delay lines are approximately equal to a period of time required by the phase decision circuit to provide the first logic signal.

17. The memory device of claim 13 wherein the phase decision circuit is further operable to provide a second logic signal corresponding to the determined phase relationship, and wherein the latch circuit comprises a first three-input logic gate coupled to receive the first logic signal and a second three-input logic gate coupled to receive the second logic signal, each of the three-input logic gates further coupled to the first and second delay lines to receive the first and second delayed clock signals, the first three-input logic gate operable to generate a first logic hold signal responsive to the first logic signal and the delayed clock signals and the second three-input logic gate operable to generate a second logic hold signal responsive to the second logic signal and the delayed clock signals.

18. The memory device of claim 17 wherein the latch circuit further comprises a latch having first and second inputs coupled to receive the first and second logic hold signals respectively, and having first and second outputs, the latch operable to set in response receiving a first logic level of the first logic hold signal and reset in response receiving a first logic level of the second logic hold signal.

19. The memory device of claim 13 wherein the array of memory cells comprise an array of DRAM memory cells.

20. A processor-based system comprising:
a data input device;
a data output device;
a processor coupled to the data input and output devices; and
a memory device coupled to the processor, comprising:
an address bus;
a control bus;
a data bus;
an address decoder coupled to the address bus;
a read/write circuit coupled to the data bus;
a control circuit coupled to the control bus;
an array of memory cells coupled to the address decoder, control circuit, and read/write circuit; and
a clock generator coupled to the control circuit, the clock generator including a phase detection circuit comprising:
a phase decision circuit having first and second input coupled to receive first and second clock signals, respectively, the phase decision circuit operable to determine a phase relationship between the first and second clock signals and to provide a first logic signal corresponding to the determined phase relationship; and
a latch circuit coupled to the phase decision circuit, the latch circuit operable to store the logic state of the first logic signal responsive to a predetermined transition of both a first delayed clock signal and a second delayed clock signals; and
a first delay line coupled to the first input terminal to receive the first input clock signal and a second delay line coupled to the second input terminal to receive the second input clock signal, the first and second delay lines configured to generate and provide to the latch circuit the first delayed clock signal relative to the first input clock signal and the second delayed clock signal relative to the second input clock signal to cause the latch circuit to store the logic state of the first logic signal responsive to a predetermined transition of both the first and second delayed clock signals.

21. The processor-based system of claim 20 wherein the array of memory cells comprise an array of DRAM memory cells.

22. The processor-based system of claim 20 wherein the phase decision circuit comprises a latch having first and second inputs coupled to receive the first and second clock signals and having first and second outputs, the latch operable to be set in response to a rising edge of the first input clock signal occurring prior to a rising edge of the second input clock signal and being reset in response to a rising edge of the second input clock signal occurring prior to a rising edge of the first input clock signal, the latch further operable to generate respective first and second output signals responsive to each set and reset response.

23. The processor-based system of claim 22 wherein the first latch comprises a pair of cross-coupled NAND gates.

24. The processor-based system of claim 20 wherein the respective delays of the first and second delay lines are approximately equal to a period of time required by the phase decision circuit to provide the first logic signal.

25. The processor-based system of claim 20 wherein the phase decision circuit is further operable to provide a second logic signal corresponding to the determined phase relationship, and wherein the latch circuit comprises a first three-input logic gate coupled to receive the first logic signal and a second three-input logic gate coupled to receive the second logic signal, each of the three-input logic gates further coupled to the first and second delay lines to receive the first and second delayed clock signals, the first three-input logic gate operable to generate a first logic hold signal responsive to the first logic signal and the delayed clock signals and the second three-input logic gate operable to generate a second logic hold signal responsive to the second logic signal and the delayed clock signals.

26. The processor-based system of claim 25 wherein the latch circuit further comprises a latch having first and second inputs coupled to receive the first and second logic hold signals respectively, and having first and second outputs, the latch operable to set in response receiving a first logic level of the first logic hold signal and reset in response receiving a first logic level of the second logic hold signal.

27. A method of generating a control signal for adjusting a phase of a clock signal comprising:
receiving a first clock signal and a second clock signal;
determining a phase relationship between the first clock signal and the second clock signal; and
saving the phase relationship determination when a predetermined transition of both the first clock signal and the second clock signal has occurred, the act of saving the phase relationship determination when a predetermined transition of both signals have occurred comprising:
delaying the first clock signal and the second clock signal to generate a first delayed clock signal and a second delayed clock signal, respectively;
saving the phase relationship determination responsive to the occurrence of a predetermined transition of the first delayed clock signal and a predetermined transition of the second delayed clock signal; and
using the saved phase relationship determination to generate the control signal.

28. The method of claim 27 wherein the act of delaying the first clock signal and the second clock signal comprises delaying the first clock signal and the second clock signal with a delay that is approximately equal to a period of time required to determine the phase relationship is between the first clock signal and the second clock signal.

29. The method of claim 27 wherein the act of determining a phase relationship between the first clock signal and the second clock signal comprises detecting a rising edge of either the first or second clock signal.

30. The method of claim 27 wherein the act of determining a phase relationship between the first clock signal and the second clock signal comprises:
latching a first logic signal to a LOW logic state when detecting a first rising edge of the clock input signal and detecting a rising edge of the second clock signal occurring in sequence after the first rising edge of the first clock signal; and
latching a second logic signal to a LOW logic state when detecting a first rising edge of the second clock signal and detecting a rising edge of the first clock signal occurring in sequence after the first rising edge of the second clock signal.

31. A method of detecting a phase difference between two signals comprising:
receiving a first clock signal and a second clock signal;
determining a phase relationship between the first clock signal and the second clock signal based on a relationship between a rising edge of the first clock signal and a rising edge of the second clock signal occurring in sequence after the rising edge of the first clock signal;
generating a first logic signal corresponding to the determination;
applying a first delay to the first and second clock signals to generate first and second delayed clock signals;
holding a logic state corresponding to the first logic signal in response to receiving the rising edge of both the delayed first clock signal and the delayed second clock signal; and
generating a phase adjustment signal for adding or removing a second delay according to the held logic state corresponding to the first logic signal.

32. The method of claim 31 wherein the act of applying a first delay to the first and second clock signals comprises applying a delay time being approximately equal to a period of time required to determine the phase relationship and generate the first logic signal.

33. The method of claim 31 wherein the act of applying a first delay comprises applying a delay time slighter greater than a period of time required to determine the phase relationship and generate the first logic signal.

* * * * *